United States Patent
Sharma

(10) Patent No.: US 8,211,844 B2
(45) Date of Patent: Jul. 3, 2012

(54) METHOD FOR CLEANING A SEMICONDUCTOR STRUCTURE AND CHEMISTRY THEREOF

(75) Inventor: Balgovind Sharma, Fishkill, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 585 days.

(21) Appl. No.: 12/091,033

(22) PCT Filed: Oct. 21, 2005

(86) PCT No.: PCT/EP2005/013518
§ 371 (c)(1), (2), (4) Date: Apr. 21, 2008

(87) PCT Pub. No.: WO2007/045269
PCT Pub. Date: Apr. 26, 2007

(65) Prior Publication Data
US 2008/0254625 A1    Oct. 16, 2008

(51) Int. Cl.
*H01L 21/306* (2006.01)

(52) U.S. Cl. ............... 510/175; 134/1.3; 134/3

(58) Field of Classification Search .......... 510/175; 134/1.3, 3
See application file for complete search history.

(56) References Cited

U.S. PATENT DOCUMENTS

| | | | |
|---|---|---|---|
| 5,017,513 A | 5/1991 | Takeuchi | |
| 5,977,041 A * | 11/1999 | Honda | 510/175 |
| 6,033,993 A * | 3/2000 | Love et al. | 438/745 |
| 6,146,467 A * | 11/2000 | Takaishi et al. | 134/3 |
| 6,228,563 B1 | 5/2001 | Starov et al. | |
| 6,268,323 B1 * | 7/2001 | Honda et al. | 510/176 |
| 6,296,714 B1 | 10/2001 | Matsuo et al. | |
| 6,333,268 B1 | 12/2001 | Starov et al. | |
| 6,361,712 B1 * | 3/2002 | Honda et al. | 252/79.3 |
| 6,372,050 B2 * | 4/2002 | Honda et al. | 134/3 |
| 6,399,552 B1 | 6/2002 | Lee et al. | |
| 6,410,494 B2 * | 6/2002 | Kakizawa et al. | 510/175 |
| 6,562,726 B1 | 5/2003 | Torek et al. | |
| 6,589,439 B2 * | 7/2003 | Honda et al. | 216/107 |
| 7,427,362 B2 * | 9/2008 | Liu | 252/79.1 |
| 7,700,533 B2 * | 4/2010 | Egbe et al. | 510/175 |
| 7,879,783 B2 * | 2/2011 | Wu | 510/175 |
| 2001/0018407 A1 * | 8/2001 | Kakizawa et al. | 510/175 |
| 2001/0032829 A1 * | 10/2001 | Honda et al. | 216/108 |
| 2001/0034313 A1 * | 10/2001 | Honda et al. | 510/176 |
| 2002/0058397 A1 | 5/2002 | Smith et al. | |
| 2003/0077903 A1 | 4/2003 | Andreas et al. | |
| 2003/0222241 A1 | 12/2003 | Torek et al. | |
| 2004/0018949 A1 * | 1/2004 | Lee | 510/175 |
| 2004/0188385 A1 * | 9/2004 | Yamada et al. | 216/83 |
| 2004/0202967 A1 | 10/2004 | Park et al. | |
| 2005/0059232 A1 | 3/2005 | Andreas | |
| 2005/0236601 A1 * | 10/2005 | Liu et al. | 252/79.1 |
| 2006/0172906 A1 * | 8/2006 | Wu et al. | 510/175 |
| 2007/0179072 A1 * | 8/2007 | Rao et al. | 510/175 |
| 2008/0004193 A1 * | 1/2008 | Lee | 510/175 |
| 2008/0041823 A1 * | 2/2008 | La et al. | 216/97 |
| 2008/0169004 A1 * | 7/2008 | Wu | 134/2 |
| 2008/0254625 A1 * | 10/2008 | Sharma | 438/689 |
| 2009/0107520 A1 * | 4/2009 | Lee et al. | 134/2 |
| 2009/0130849 A1 * | 5/2009 | Lee | 438/693 |
| 2009/0133716 A1 * | 5/2009 | Lee | 134/3 |
| 2009/0137191 A1 * | 5/2009 | Lee | 451/36 |
| 2009/0212021 A1 * | 8/2009 | Bernhard et al. | 216/109 |
| 2009/0229629 A1 * | 9/2009 | Lee et al. | 134/3 |
| 2009/0281017 A1 * | 11/2009 | Suzuki et al. | 510/176 |
| 2010/0015804 A1 * | 1/2010 | Sharma | 438/685 |
| 2010/0043823 A1 * | 2/2010 | Lee | 134/1.3 |
| 2010/0105595 A1 * | 4/2010 | Lee | 510/176 |
| 2010/0152086 A1 * | 6/2010 | Wu et al. | 510/175 |

FOREIGN PATENT DOCUMENTS

DE    3314971 A1    10/1984
EP    1536291 A1    6/2005

OTHER PUBLICATIONS

PCT Application No. PCT/EP2005/013518; Search Report and Written Opinion dated Jun. 9, 2006.

\* cited by examiner

*Primary Examiner* — Gregory Webb

(57) ABSTRACT

A method for removing a etch residue (e.g., polymer or particle) from a semiconductor structure and using a cleaning chemistry and the composition of the chemistry is described. By providing a semiconductor structure with etch residue on it, the semiconductor substrate is then placed in a chemistry to remove the particle, wherein the chemistry comprises dilute hydrofluoric acid and a carboxylic acid. In one embodiment the carboxylic acid is selected from tartaric acid, acetic acid, citric acid, glycolic acid, oxalic acid, salicyclic acid, or phthalic acid, and the dilute hydrofluoric acid is approximately 0.1 weight % of hydrofluoric acid.

18 Claims, No Drawings

METHOD FOR CLEANING A SEMICONDUCTOR STRUCTURE AND CHEMISTRY THEREOF

FIELD OF THE INVENTION

This invention relates generally to semiconductor structures, and more specifically, to cleaning semiconductor structures.

BACKGROUND

When manufacturing a semiconductor device, various semiconductor structures are created by etching layers. During etching, etch residue, which is a polymer or particle, is created. For example, when etching to form a via the etch residue will be formed on the bottom and sidewalls of the via. Typically, the etch residues are organo-metallic polymers and include elements such as carbon, oxygen, fluorine, silicon, copper, hydrogen and nitrogen. The particles are undesirable because they contribute to low yield, high via resistance, via voids and other reliability issues. Therefore, there is a need to remove these particles.

In the industry, complex multi-component mixtures of ammonium fluoride, corrosion inhibitors, chelating agents, and complexing agents, are used to remove the undesirable etch residue. However these mixtures can react with underlying materials and create yield loss and result in poor electrical performance of the semiconductor device. In addition, these mixtures are expensive and thus, increase manufacturing costs. Thus, a need exists for a chemistry that removes etch residue created from etching, does not attack underlying layers, and is inexpensive.

SUMMARY OF THE INVENTION

The present invention provides a method for removing etch residue from a semiconductor structure and a chemistry for use in such a method, as described in the accompanying claims.

DETAILED DESCRIPTION OF THE PREFERRED EMBODIMENTS

The embodiments of the invention described below provide a simple and inexpensive chemistry to remove etch residue, which may be particles or polymers that result from etching semiconductor structures, includes only a few inexpensive active component. The chemistry is manufacturable because it is simple to create and inexpensive (e.g., less than US$40 per gallon.). The chemistry improves yield and reliability. Furthermore, the chemistry can be used with semiconductor structures as they are scaled down.

Organic acids are desirable for removing etch residues. The carboxylic acids contain an acid or hydrophilic (COOH) and a hydrophobic component (C—H) and hence are well suited to remove post-etch residues. In particular most carboxylic acids are desirable for cleaning etch residues because they include both the organic component to dissolve the hydrocarbons of the etch residue and the polar acid COOH group that helps remove the charged or hydrophilic components of the etch residue. The presence of an acid (or carboxyl) group and hydrocarbon group further helps in chelating metals and passivating the metal surface or minimizing metal corrosion. In other words, carboxylic acids include a COOH group, which is hydrophilic, and a hydrocarbon group which is attracted to oil. In addition, some of these carboxylic acids (known as hydroxy carboxylic acids) may include an additional OH or alcohol group that enhances residue removal efficiency by dissolving or etching the residues and also aids in minimizing corrosion on metal surfaces. The presence of dual acid or carboxyl and alcohol groups (COOH and OH) can provide unique properties in removing etch residues and minimizing copper corrosion. Etch residue includes some parts that dissolve in water and other parts that dissolve in oil and thus, a carboxylic acid that has a COOH group, a hydrocarbon, and an OH group can be very effective in dissolving or etching all of the etch residue. In addition, COOH and OH groups can be very effective in chelating metal ions and passivating the metal surface. Some carboxylic acids are acetic, citric, oxalic, salicyclic, tartaric, glycolic, and phthalic acids.

While any carboxylic acid could be used to form a cleaning chemistry, many are not as efficient as tartaric acid. For this reason tartaric acid is preferred even though any acid can be used. For example, oxalic acid ($H_2C_2O_4$) does not include both a COOH group and an OH group and thus, may have limited cleaning efficiency, which may make oxalic acid an undesirable cleaning chemistry. More specifically, oxalic acid lacks any OH groups. The absence of an OH group results in reduced dissolving, etching, passivating, and chelating powers. In addition, because oxalic acid, shown below, does not have any alcohol or OH groups, it

Oxalic Acid has limited cleaning effectiveness and thus another active component, such as surfactants, fluorides, amines, corrosion inhibitors, and chelating agents, are needed to improve cleaning efficiency. Thus, an additional active ingredient is needed to offset oxalic acid's lack of cleaning ability. Because an additional active ingredient is needed to offset oxalic acid's lack of cleaning ability, the cost and complexity of the cleaning chemistry is increased. Thus, although oxalic acid could be used, it is not a preferred carboxylic acid.

Some other carboxylic acids have either only one —OH group, such as citric acid ($C_6H_8O_7$), or only one —COOH group, such as acetic acid ($C_2H_4O_2$) and thus, are not as effective as tartaric acid. However, they can be used, if desired. While citric acid, shown below, and acetic acid, shown below, both have OH and COOH groups, their chemistries

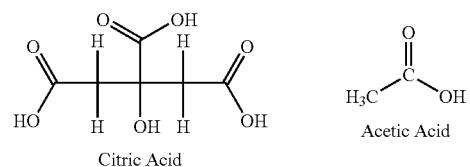

Citric Acid     Acetic Acid are not as desirable as tartaric acid because they do not have as many OH or COOH groups. Because citric acid has only one OH group it has limited dissolving, chelating, passivating, and cleaning efficiency. Similarly, because acetic acid has only one COOH group (and no OH group), it will be less effective in dissolving, cleaning, passivating, and chelating. Additional components such as surfactant, fluorides, amines, chelating agents and others may be required for effective cleaning for molecules that either lack or contain one OH or COOH group. In contrast, because tartaric acid has two COOH and two OH groups it is very effective in cleaning etch residues, chelating metal ions, passivating copper surface, and dissolving polymers.

Although any carboxylic acid can be used, tartaric acid is preferred because it has two COOH and two OH groups. The two COOH groups and two OH groups provide tartaric acid with strong dissolving, wetting, and dissolution properties that are targeted for the removal of etch residues (consisting of hydrocarbons and hydrophilic components). Thus, tartaric acid is a good component of the cleaning chemistry. Furthermore, tartaric acid is a relatively inexpensive carboxylic acid and is thus, preferred for manufacturing. In addition, tartaric acid chelates metal ions, removes oxides, passivates, and protects the metal surface from corrosion, and provides a hydrophobic surface for robust barrier deposition resulting in yield improvement. Also, tartaric acid will dissolve hydrocarbons and hydrophilic components of the residue, chelate metal ions, and remove oxide on metal surfaces without damaging any underlying layers, such as a metal layer.

Tartaric acid has the formula of $C_4H_6O_6$ [(COOH—CH—OH)$_2$] and thus, has 2 COOH and 2 OH groups. The chemical structure of tartaric acid can be shown as:

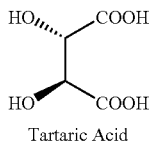

Tartaric Acid

While tartaric acid is a suitable cleaning chemistry and could be used alone, it is desirable that another active component is used in the cleaning chemistry to help remove etch residue that tartaric acid sometimes leaves behind on the sidewalls of features, such as vias and trenches. In one embodiment, the additional active component is hydrogen fluoride (HF). The HF etches away portions of the sidewalls of a feature and in doing so removes any etch residue that may have formed on the sidewalls during etching. HF also helps in removing metal oxide (specifically copper oxide) thereby providing a clean metal surface. In a preferred embodiment, the HF is dilute HF (DHF) because a high concentration, such as a concentration greater than 10 weight %, can attack both metallic and dielectric surfaces. In one embodiment, DHF means that the concentration is less than or equal to approximately 10 weight %, or more specifically less than approximately 1 weight %, or more preferably less than approximately 0.5 weight % or even more preferably less than approximately 0.1 weight %. In one embodiment, the concentration of HF is approximately 0.1 weight %. In one embodiment, the concentration of DHF used is approximately 0.01 to 1 weight % or preferably approximately 0.01 to 0.1 weight %. In one embodiment, the concentration of tartaric acid is approximately 1 to 10 weight % or preferably approximately 1 to 5 weight %. Thus, in one embodiment, the cleaning chemistry includes DHF at a concentration of approximately 0.01 to 1 weight % and tartaric acid at a concentration of approximately 1 to 5 weight %.

In addition, inactive component(s), such as water may be added to the cleaning chemistry. The water may be added to dilute the strength of DHF and the carboxylic acid so that the final concentration of the carboxylic acid less than 20 weight % and DHF is less than 1 weight %. Although not required, other inactive components that may be added include alcohols (such as IPA, propanol, butanol, and others), glycols, and oliophilic reagents, such as decane or decanols.

Thus, the mixture of carboxylic acid (e.g., tartaric acid) and HF (e.g., DHF) can be used for cleaning, especially for removing etch residue on any surface. To clean the semiconductor structure, in one embodiment, a layer is formed over a semiconductor wafer. The semiconductor wafer can be any semiconductor material or combinations of materials, such as gallium arsenide, silicon germanium, silicon-on-insulator (SOI) (e.g., fully depleted SOI (FDSOI)), silicon, monocrystalline silicon, the like, and combinations of the above. Furthermore, the layer may be any layer. For example it may be a dielectric (e.g., a high dielectric constant dielectric), a metal (e.g., copper of aluminum), or a layer that includes silicon (e.g., silicide or polysilicon). In addition, the layer may be formed over other layers. These other layers may be a dielectric (e.g., a high dielectric constant dielectric), a metal (e.g., copper of aluminum), or a layer that includes silicon (e.g., silicide or polysilicon). The layer is patterned by using conventional etching processes to form a semiconductor structure. For example, a via or trench may be formed in the layer or the layer may be patterned to form a gate electrode. During the etch process, etch residue are formed on the layer being patterned. If the layer being patterned forms a via or trench, the etch residue may be formed at the bottom or sidewalls of the via or trench. If the layer is patterned to form a gate electrode, etch residue may be formed on the sidewalls of the gate electrode and on the substantially horizontal surfaces of the layer that are formed next to the gate electrode after etching.

The etch residue is subsequently removed using a cleaning chemistry that includes any carboxylic acid and HF. In one embodiment, the cleaning chemistry includes tartaric acid and DHF with the concentration of DHF being approximately 0.01 to 1 weight % and the concentration of tartaric acid being approximately 1 to 10%; the remaining percentage may be an inactive component, such as water Using this concentration of DHF and tartaric acid, the semiconductor structure may be exposed to the cleaning chemistry for approximately 45 seconds to 3 minutes in a single wafer tool and approximately 4 to 15 minutes in a batch tool. However, one skilled in the art recognizes that the greater the concentration of tartaric acid and DHF, the less time the semiconductor structure needs to be exposed to the cleaning chemistry. For example, if tartaric acid concentration is greater than approximately 5% to 20 weight % or the DHF concentration is 0.1 to 4 weight % then the semiconductor structure may be exposed to the cleaning chemistry for only 20 seconds to 2 minutes in a single wafer tool and approximately 3 to 7 minutes in a batch tool. A concentration of approximately 1 to 5 weight % tartaric acid and 0.01 to 0.1 weight % may be applied for approximately 1 to 4 minutes at room temperature, but at higher temperatures (approximately 25 to 45° C.), the exposure time may be reduced to less than 2 minutes in a single wafer tool and less than 5 minutes in a batch tool.

The cleaning chemistry may be applied to the semiconductor structure using any process. For example, the semiconductor wafer and structure may be dipped into the cleaning chemistry. Alternatively, the semiconductor wafer and structure may be sprayed with the cleaning chemistry. In one embodiment, the cleaning chemistry may be sprayed (or dispensed) onto the wafer for a period of approximately 45 seconds to 3 minutes in a single wafer tool and approximately 4 to 15 minutes in a batch tool. Next, the wafer may be rinsed in water, for approximately 30 seconds to 2 minutes in a single wafer tool or approximately 5 to 10 minutes in a batch tool. Afterwards, the wafer is dried.

By now it should be appreciated that there has been provided a cleaning chemistry that in one embodiment is used for removing etch residue, including those that may be formed on the sidewall of a patterned feature. In a preferred embodiment, the cleaning chemistry includes tartaric acid and dilute HF. However, in other embodiments, the cleaning chemistry includes any carboxylic acid (such as acetic, citric, glycolic, oxalic, tartaric, salicyclic acid, and phthalic acids) and dilute HF. The cleaning chemistry is most likely to be used to remove etch residue that is formed after etching vias or trenches. The chemistry is a simple because it includes only a few active components and is thus, inexpensive, simple, and easy to implement. Furthermore, this chemistry improves yield.

More specifically, in one embodiment, a method for removing a etch residue from a semiconductor structure includes providing a semiconductor structure with a particle on it, and placing the semiconductor structure in a chemistry to remove the particle, wherein the chemistry comprises dilute hydrofluoric acid and a carboxylic acid. In one embodiment, chemistry comprises 0.1 wt % hydrofluoric acid. In one embodiment, the chemistry further comprises water. In one embodiment, the carboxylic acid is tartaric acid. However, in other embodiments, the cleaning chemistry includes any carboxylic acid (such as acetic, citric, glycolic, oxalic salicyclic acid, tartaric, and phthalic acids) and dilute HF. In one embodiment, the semiconductor structure comprises a metal and the particle is removed from the metal. In one embodiment, the method further includes forming the etch residue on the semiconductor structure by etching a layer on the semiconductor structure. In one embodiment, placing the semiconductor in a chemistry is performed for approximately 30 seconds to 10 minutes. In one embodiment, placing the semiconductor in a chemistry further comprise exposing the semiconductor in the chemistry at a temperature of approximately 20 to 40° C.

In one embodiment, a chemistry for removing a particle from a semiconductor structure includes dilute hydrofluoric acid and a carboxylic acid. In one embodiment, the carboxylic acid is tartaric acid. However, in other embodiments, the carboxylic acid includes tartaric, acetic, citric, glycolic, oxalic, phthalic, or salicyclic acids. In one embodiment, the chemistry comprises less than approximately 1 wt % hydrofluoric acid. In one embodiment, the chemistry comprises approximately 0.1 wt % hydrofluoric acid. In one embodiment, the carboxylic acid is selected from the group consisting of acetic acid, citric acid, oxalic acid, salicyclic acid, tartaric acid, glycolic acid, and phthalic acid. In one embodiment, the concentration of carboxylic acid is 1 to 10 weight % and DHF is 0.01 to 1 weight %.

In the foregoing specification, the invention has been described with reference to specific embodiments. However, one of ordinary skill in the art appreciates that various modifications and changes can be made-without departing from the scope of the present invention as set forth in the claims below. Accordingly, the specification is to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The invention claimed is:

1. A method for removing an etch residue from a semiconductor structure with the etch residue on it, the method comprising:
    placing the semiconductor structure in a chemistry to remove the particle, wherein the chemistry consists of dilute hydrofluoric acid in a concentration of less than or equal to 10 weight %, tartaric acid in a concentration of 1 to 10%, and for the remaining percentage an inactive component or components.

2. The method of claim 1, wherein the hydrofluoric acid has a concentration of at least approximately 0.1 weight %.

3. The method of claim 1, further including forming the etch residue on the semiconductor structure by etching a layer on the semiconductor structure.

4. The method of claim 1, wherein placing the semiconductor in a chemistry is performed for approximately 30 seconds to 10 minutes.

5. The method of claim 1, wherein placing the semiconductor in a chemistry includes exposing the semiconductor in the chemistry at a temperature of approximately 20 to 40° C.

6. A chemistry for removing a particle from a semiconductor structure, the chemistry consisting of dilute hydrofluoric acid in a concentration of less than or equal to 10 weight % and tartaric acid in a concentration of 1 to 10%, and for the remaining percentage an inactive component or components.

7. The chemistry of claim 6, wherein the hydrofluoric acid has a concentration of at least approximately 0.1 weight %.

8. The chemistry of claim 6, wherein the concentration of the dilute hydrofluoric acid is between approximately 0.01 to 1 weight %.

9. The method of claim 2, further including forming the etch residue on the semiconductor structure by etching a layer on the semiconductor structure.

10. The method of claim 2, wherein placing the semiconductor in a chemistry is performed for approximately 30 seconds to 10 minutes.

11. The method of claim 2, wherein placing the semiconductor in a chemistry includes exposing the semiconductor in the chemistry at a temperature of approximately 20 to 40° C.

12. The method of claim 3, wherein placing the semiconductor in a chemistry includes exposing the semiconductor in the chemistry at a temperature of approximately 20 to 40° C.

13. The method of claim 4, wherein placing the semiconductor in a chemistry includes exposing the semiconductor in the chemistry at a temperature of approximately 20 to 40° C.

14. The method of claim 3, wherein placing the semiconductor in a chemistry is performed for approximately 30 seconds to 10 minutes.

15. The method of claim 14, wherein placing the semiconductor in a chemistry includes exposing the semiconductor in the chemistry at a temperature of approximately 20 to 40° C.

16. The method of claim 1, wherein the concentration of the dilute hydrofluoric acid is between approximately 0.01 to 1 weight %.

17. The method of claim 1, wherein the inactive component or components are one of more selected from the group consisting of: water, alcohols, glycols, oliophilic reagents.

18. The chemistry of claim 6, wherein the inactive component or components are one of more selected from the group consisting of: water, alcohols, glycols, oliophilic reagents.

* * * * *